United States Patent [19]
Bergmann

[11] Patent Number: 6,128,133
[45] Date of Patent: Oct. 3, 2000

[54] OPTICAL BEAMSPLITTER

[75] Inventor: Ernest Eisenhardt Bergmann, Lehigh County, Pa.

[73] Assignee: Lucent Technologies Inc., Murray Hill, N.J.

[21] Appl. No.: 09/218,562

[22] Filed: Dec. 22, 1998

[51] Int. Cl.$^7$ ................................ G02B 5/30; F21V 9/04
[52] U.S. Cl. .................... 359/487; 359/583; 359/629; 359/483
[58] Field of Search .................... 359/487, 488, 359/583, 359, 629, 501, 483

[56] References Cited

U.S. PATENT DOCUMENTS

| | | | |
|---|---|---|---|
| 4,492,436 | 1/1985 | Bergmann | 350/395 |
| 4,659,185 | 4/1987 | Aughton | 359/487 |
| 4,664,484 | 5/1987 | Hines | 359/487 |
| 5,309,422 | 5/1994 | Kuroki et al. | 359/487 |
| 5,513,035 | 4/1996 | Miyatake et al. | 359/352 |
| 5,579,159 | 11/1996 | Ito | 359/487 |

*Primary Examiner*—Darren Schuberg
*Assistant Examiner*—Fayez Assaf
*Attorney, Agent, or Firm*—Lester H. Birnbaum

[57] ABSTRACT

The invention is a beamsplitter and an optical module including a beamsplitter where the beamsplitter comprising a body having two major surfaces. At least one major surface of the body is coated so that the said major surface reflects incident light of a desired wavelength which is primarily a first polarization. The other major surface reflects incident light of the desired wavelength which is primarily an orthogonal polarization without the element substantially changing the polarization of the light as it passes through the element.

28 Claims, 5 Drawing Sheets

REFLECTANCE (dB) VS WAVELENGTH (nm)

REFLECTANCE (dB) VS WAVELENGTH (nm)

OPTICAL BEAMSPLITTER

FIELD OF THE INVENTION

This invention relates to optical beamsplitters, and optical modules including beamsplitters.

BACKGROUND OF THE INVENTION

Optical beamsplitters are used in a wide variety of optical apparatus. Typical beamsplitters include a surface which reflects a portion of incident light and transmits much of the remaining light. In most cases, it is desirable to have the light reflected be a fixed fraction of the light input or of the light transmitted, and this fraction should be reasonably independent of the polarization and wavelength of the input light. These conditions are particularly important when using a beam splitter to monitor optical power. Unfortunately, light reflected from the two major surfaces can interfere and produce an undesired ripple in the wavelength response of the beamsplitter. Further, when the beamsplitter is at an angle to the incident light, different polarizations will be reflected with different strengths producing polarization dependent loss (PDL).

Beamsplitters have been proposed which are independent of the polarization of the input light. For example, U.S. Pat. No. 4,492,436 issued to Bergmann describes a beamsplitter including a slab of birefringent material which changes the polarization of light refracted from the first major surface relative to the light reflected from the first surface. When the refracted light is reflected from the second major surface that reflection will be polarized orthogonally to the light reflected from the first major surface and no significant interference between the reflections of the two surfaces will occur.

SUMMARY OF THE INVENTION

The invention is a beamsplitter and an optical module including a beamsplitter where the beamsplitter comprises a body having two major surfaces. At least one major surface of the body is coated so that the said major surface reflects light of a desired wavelength which is primarily a first polarization and the other major surface reflects light of the desired wavelength which is primarily an orthogonal polarization without the element substantially changing the polarization of the light as it passes through the element.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
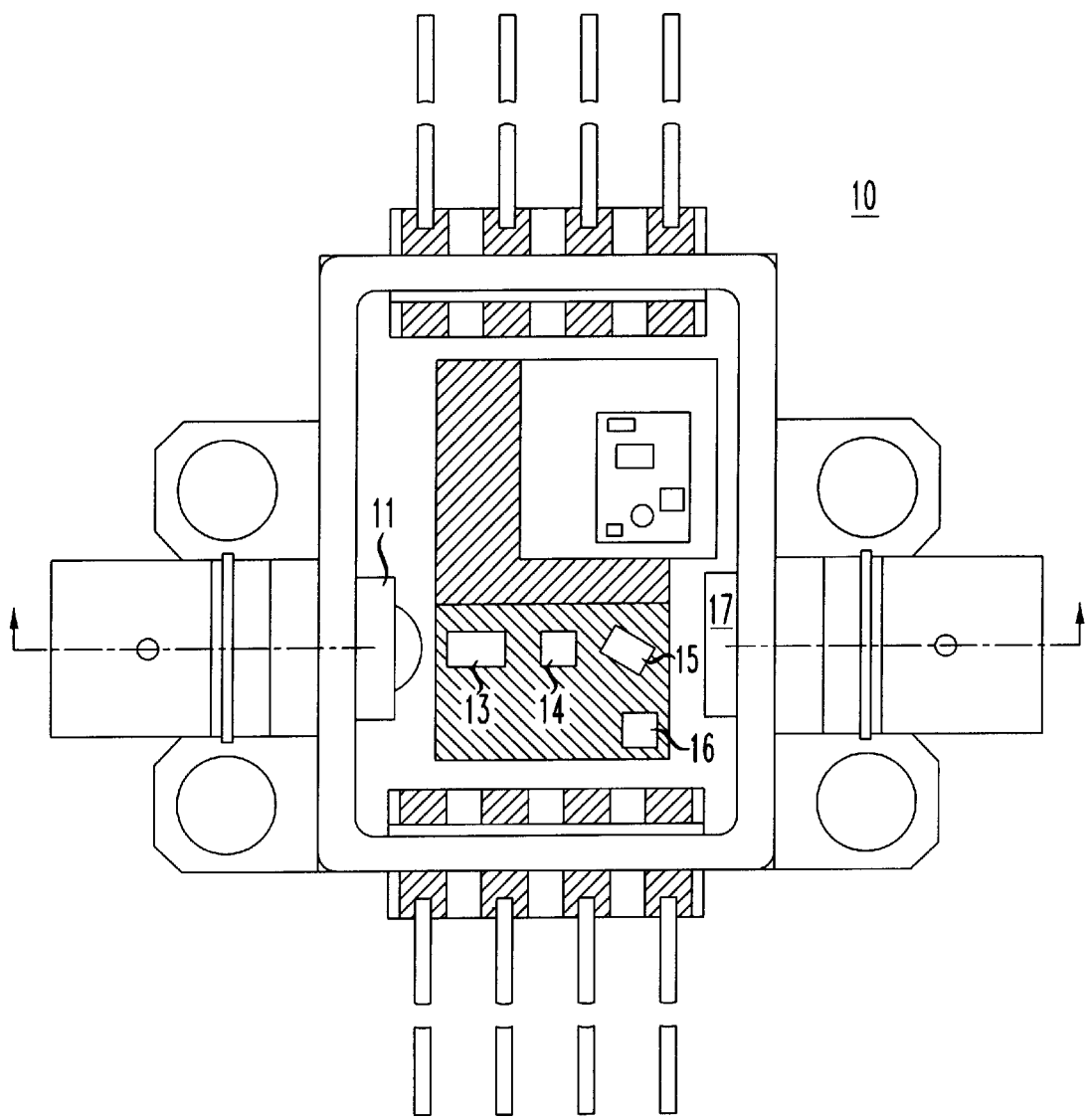
FIG. 1 is a plan view of a device including a beamsplitter in accordance with an embodiment of the invention.

FIG. 1 illustrates a typical optical module, 10, incorporating the invention. In this particular example, the device, 10, is a integrated amplifier module designed to transmit multiplexed light from a fiber (not shown) at an optical port, 11, and a source, 12. Typically, the light from the port has a wavelength of approximately 1550 nm, while the source produces light of approximately 980 nm. Light from the port, 11, is sent through an isolator, 13, a flattening filter, 14, and is made incident on a beamsplitter, 15. The beamsplitter, 15, reflects a portion of the light from source 11 onto a tap, 16, which monitors the power of the light. The remaining portion of the light is sent to the output port, 17, of the device. The beamsplitter, 15, also reflects all of the light from source, 12, to the output port to produce a multiplexed beam.

Figure 2:
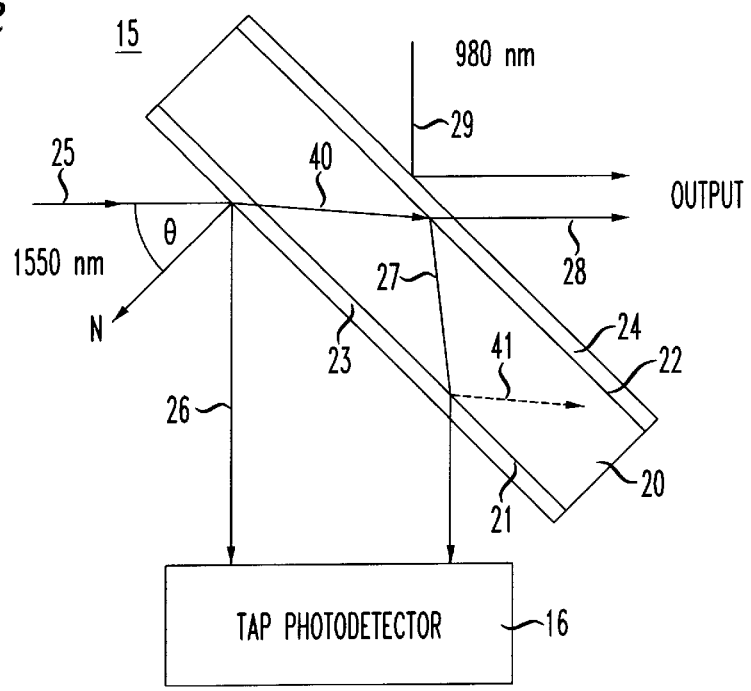
FIG. 2 is an enlarged schematic view of a portion of the device of FIG. 1.

FIG. 2 is an enlarged schematic view of the beamsplitter element, 15, in accordance with an embodiment of the invention. The element includes a body, 20, of transparent material such as glass. The body, 20, has two opposite major surfaces, 21 and 22, which are essentially parallel in this example. (In the context of this application "essentially parallel" means the surfaces make an angle of 2 degrees or less.) Each surface, 21 and 22, includes thereon a thin coating, 23 and 24, respectively, each coating typically including multi-layer thin films. The body is tilted so that the normal, N, to the first major surface, 21, makes an angle, θ, of typically 45 degrees with the incoming light beam, illustrated by arrow 25. As illustrated by the arrows, the incoming light beam, 25, is partially reflected at the coating 23 to form a beam, 26, directed to the tap photodetector, 16. The remainder of the incoming beam, 25 (labeled 40), is transmitted by refraction through the body, 20, and is incident on the other major surface, 22, where it is again partially reflected to form a beam, 27, directed to the tap. The remainder of the beam, 28, is transmitted and refracted to the output. Also illustrated is the reflection of the second beam, 29, (from source 12) by the coating 24 to the output.

It is desired that the total light reaching the tap photodetector, 16, from beams 26 and 27, be a fixed fraction of the incoming or transmitted light, 25 or 28, usually approximately 1 percent and generally between 0.1% and 5%. Such a result is difficult to achieve since the two beams, 26 and 27, can interfere with each other if surface 21 and 22 are parallel within approximately 0.1 degrees and produce an undesired ripple in the wavelength response. The beamsplitter of the present invention can avoid this problem by an appropriate choice of at least one (usually both) of the coatings, 23 and 24, to ensure that the reflected beams, 26 and 27, are orthogonally polarized.

Figure 3:
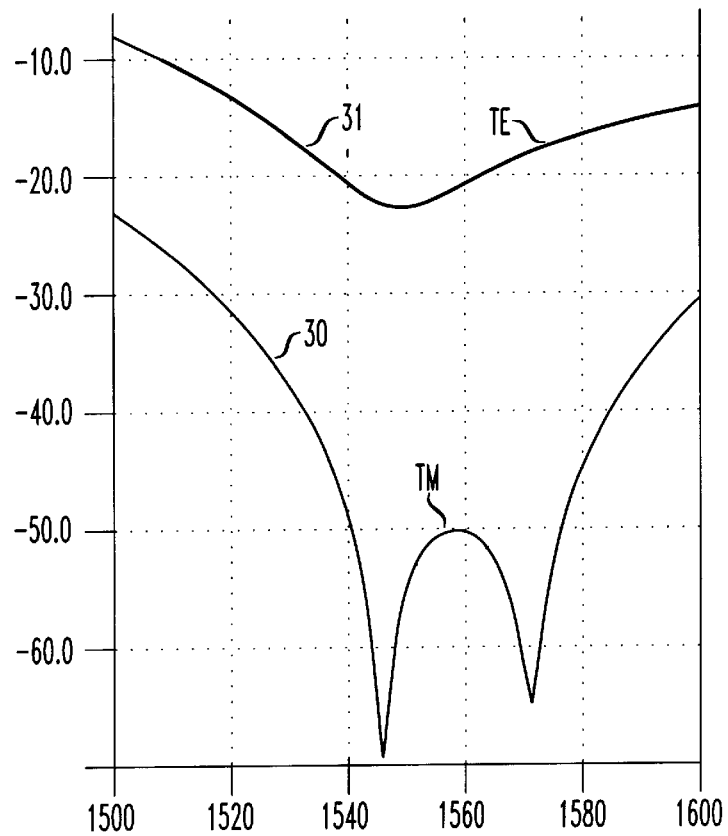
FIGS. 3–6 are curves showing reflectance characteristics for various portions of the beamsplitter in accordance with some embodiments of the invention.

FIG. 3 illustrates reflection characteristics for a material which may be used for the coating, 23. The material shown in FIG. 3 generally comprises alternating layers of $MgF_2$ and ZnS of varying thicknesses or some other pair of materials having comparatively high and low indices of refraction. As known in the art, these thicknesses are chosen to produce the desired wavelength reflectance characteristics. For example, the thicknesses might vary between 0 and 377 nm (1550 nm referenced quarter wave optical thickness in the range 0–2.12). Those skilled in the art can readily design a particular coating. For example, the commercially available program designated TF Calc™ sold by Software Spectra Inc. may be employed. Curve 30 shows reflectance for the TM polarization component, and curve 31 shows reflectance for the TE polarization component of the incident light. It will be noted that for the desired wavelength (1550 nm) the coatings will reflect the TE component (at about −21 dB) while the TM component is essentially not reflected. Thus, the surface 21 with this material for coating 23 will reflect approximately 1 percent of the TE component of the incident light.

Figure 4:
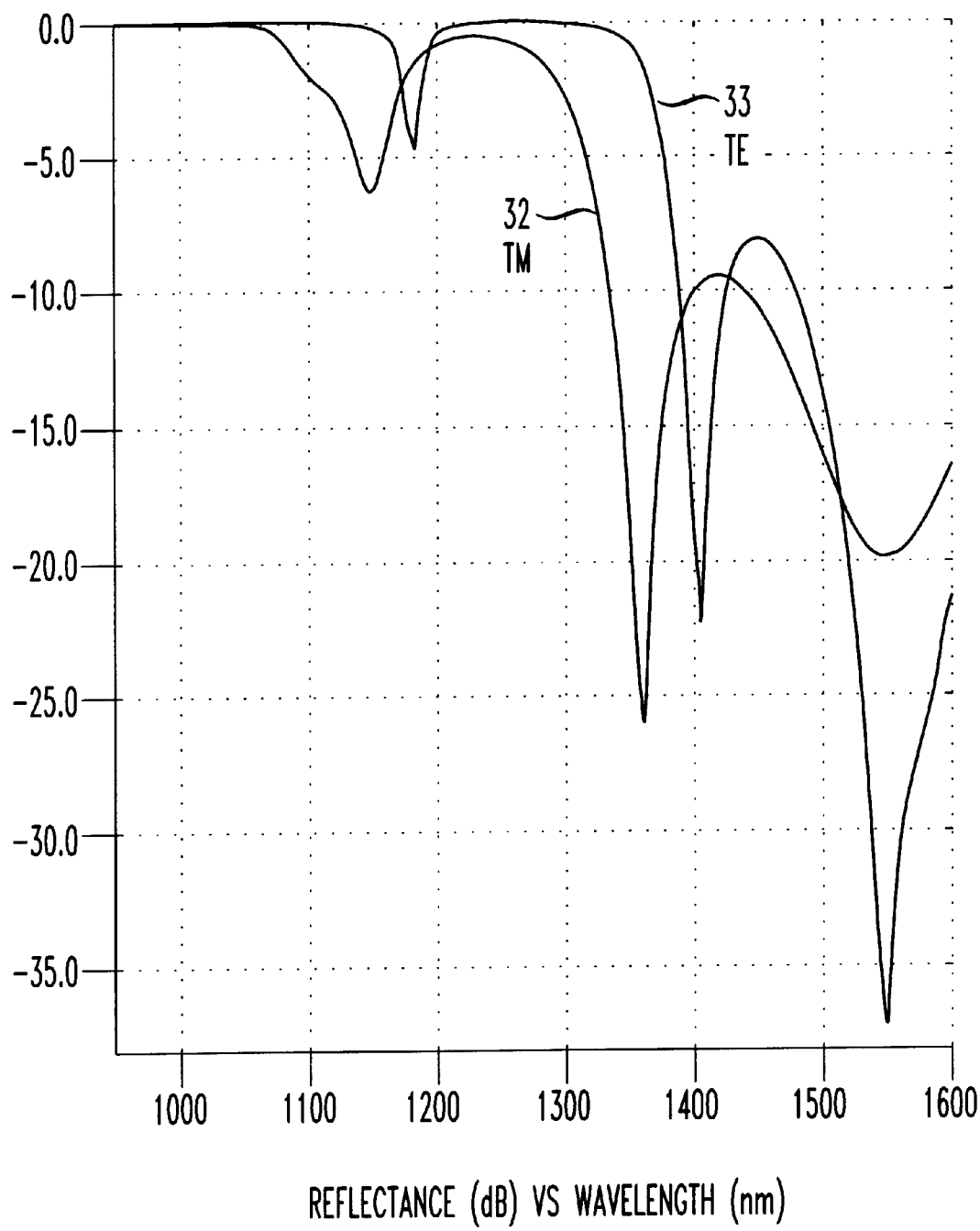
Figure 5:
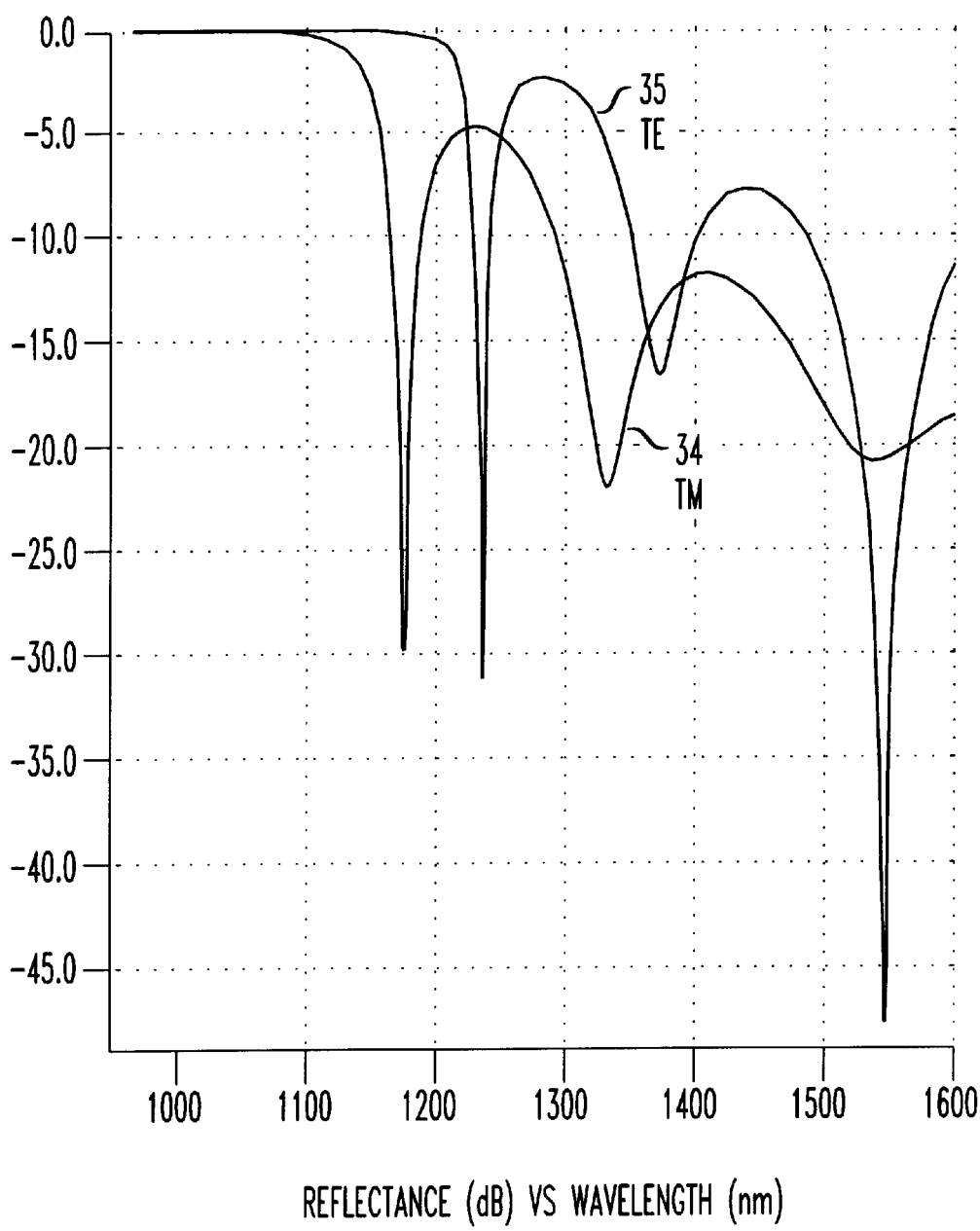

FIGS. 4 and 5 illustrate the reflectance characteristic for two different materials which may be used for a coating, 24, which can be applied to surface 22 of the body, 20. The material shown in FIG. 4 comprises alternating layers of MgF$_2$ and ZnS with thicknesses designed to produce the desired reflectance characteristics. For example, the thicknesses can vary between zero and 695 nm (quarter wave optical thickness in the range of 0 to 3.91 referenced to 980 nm). It will be noted that this coating will reflect about −21 dB of the TM component (curve 32) of the incident light while the TE component (curve 33) is essentially not reflected at a wavelength of approximately 1550 nm. The material shown in FIG. 5 generally comprises alternating layers of TiO$_2$ and SiO$_2$ of varying thicknesses to produce the desired reflectance characteristics. For example, the thickness might vary between 0 and 220 nm (quarter wave optical thicknesses in the range 0–1.29). This material will also reflect about −21 dB of the TM component (curve 34) while the TE component (curve 35) is essentially not reflected at a wavelength of 155 nm.

Thus in FIG. 2, the coatings, 23 and 24, reflect light beams, 26 and 27, which are orthogonally polarized and will not interfere. This result is achieved without altering the polarization of the beam, 40, within the body, 20. This means that the body, 20, need not be birefringent, and there is no concern about the orientation of a possible optic axis relative to the major surfaces. Nor is it necessary that the body be rotated to a particular orientation. Finally, the thickness of the body, 20, is not critical. (It will also be noted that since beam 27 is polarized orthogonally to beam 26, there will be essentially no reflection of beam 27 when it is incident on coating 23, and, therefore, beam 41 is essentially zero.)

It is generally preferred that the major surfaces, 21 and 22, be at a slight angle with respect to each other, generally greater than a tenth of a degree. This is because a small amount of the TE component will be reflected by coating 23, and a small amount of the TE component will be reflected by coating 24, possibly causing some small amount of interference. In the event of such "polarization leakage", nonparallel major surfaces will produce nonparallel reflected beams, 26 and 27, thereby reducing any interference (which would lead to wavelength ripple) between the beams.

It is also generally desirable to have the coatings, 23 and 24, reflect approximately the same intensity of polarization component (TE and TM components respectively) to minimize polarization dependent loss for the transmitted beam 28 and for the photodetector signal (combination of 26 and 27).

Figure 6:
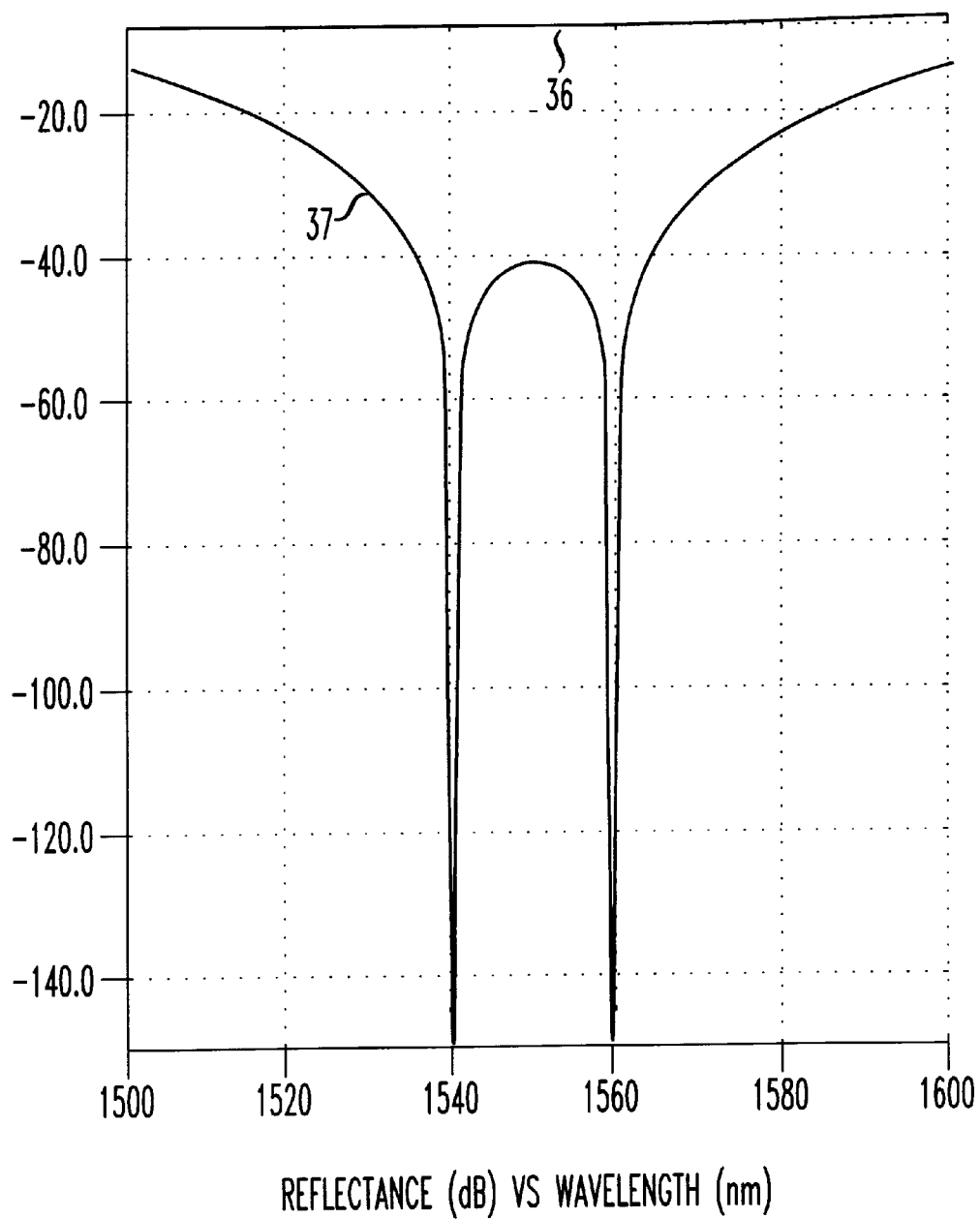

In accordance with another embodiment, one of the major surfaces, e.g., 21, can be oriented so that the angle, θ, between the normal and the incident beam is at Brewster's angle. (As known in the art, Brewster's angle is the angle at which a single polarization is reflected.) Brewster's angle is approximately 56.5 degrees for a material with an index of refraction of 1.5, such as the glass body in these examples. At this angle, the surface 21, with no coating thereon, will reflect about 17 percent of the TE component of the incident light, while the TM component is not reflected. At the other major surface, 22, the coating, 24, is chosen to have the reflectance characteristics illustrated in FIG. 6, where the TM component (curve 36) is reflected at about 17 percent, and the TE component (curve 37) is essentially not reflected. Such a characteristic can be achieved, for example, with a coating comprising alternating layers of MgF$_2$ and ZnS with thicknesses in the range 0.94–750 nm (550 nm referenced quarter wave optical thicknesses in the range 0.003 to 2.17). Thus the combination of an uncoated surface oriented at Brewster's angle and a coated opposite major surface can also achieve orthogonally polarized reflected beams.

The invention is particularly useful for communications systems emphasizing wavelengths in the range 1535–1565 nm. However, it will be understood that it may be applied to other wavelengths.

What is claimed is:

1. An optical module including a beamsplitter comprising a body having two major surfaces, at least one major surface of the body being coated so that the said major surface reflects a first portion of incident light of a desired wavelength which is primarily a first polarization, and the other major surface reflects a second portion of the incident light of the desired wavelength which is primarily an orthogonal polarization with respect to the first polarization while transmitting a remaining portion of the incident light without the body substantially changing the polarization of the light as it passes through the body.

2. The module according to claim 1 wherein the body is transparent.

3. The module according to claim 1 wherein the major surfaces are essentially parallel.

4. The module according to claim 1 wherein at least one major surface has a normal line which is at Brewster's angle with respect to the incident light.

5. The module according to claim 4 wherein the surface at Brewster's angle is uncoated while the other surface includes a coating which reflects substantially only the TM component of the incident light.

6. The module according to claim 5 wherein the coating comprises alternating layers of MgF$_2$ and ZnS.

7. The module according to claim 1 wherein both major surfaces are coated, with one coating reflecting substantially only the TM component of the incident light and the other coating reflecting substantially only the TE component of the incident light.

8. The module according to claim 7 wherein both coatings comprises a material selected from alternating layers of MgF$_2$, ZnS, TiO$_2$, and SiO$_2$.

9. The module according to claim 1 wherein at least one major surface has a normal which makes an angle of approximately 45 degrees with respect to the incident light.

10. The module according to claim 1 wherein the body is isotropic.

11. The module according to claim 10 wherein the body comprises glass.

12. The module according to claim 1 wherein the desired wavelength of the incident light is within the range 1535 to 1565 nm.

13. A beamsplitter comprising a body having two major surfaces, at least one major surface of the body being coated so that the said major surface reflects a first portion of incident light of a desired wavelength which is primarily a first polarization, and the other major surface reflects a second portion of the incident light of the desired wavelength which is primarily an orthogonal polarization with respect to the first polarization while transmitting a remaining portion of the incident light without the body substantially changing the polarization of the light as it passes through the body.

14. The beamsplitter according to claim 13 wherein the body is transparent.

15. The beamsplitter according to claim 13 wherein the major surfaces are essentially parallel.

16. The beamsplitter according to claim 13 wherein at least one major surface has a normal line which is at Brewster's angle with respect to the incident light.

17. The beamsplitter according to claim 16 wherein the surface at Brewster's angle is uncoated while the other surface includes a coating which reflects substantially only the TM component of the incident light.

18. The beamsplitter according to claim 17 wherein the coating comprises alternating layers of $MgF_2$ and ZnS.

19. The beamsplitter according to claim 13 wherein both major surfaces are coated, with one coating reflecting substantially only the TM component of the incident light and the other coating reflecting substantially only the TE component of the incident light.

20. The module according to claim 19 wherein both coatings comprises a material selected from alternating layers of $MgF_2$, ZnS, $TiO_2$, and $SiO_2$.

21. The beamsplitter according to claim 13 wherein at least one major surface has a normal which makes an angle of approximately 45 degrees with respect to the incident light.

22. The beamsplitter according to claim 13 wherein the body is isotropic.

23. The module according to claim 22 wherein the body comprises glass.

24. The beamsplitter according to claim 13 wherein the desired wavelength of the incident light is within the range 1535 to 1565 nm.

25. The module according to claim 1 wherein the first and second portions are approximately equal in intensity.

26. The module according to claim 1 wherein the first and second portions have a combined intensity which is 0.1–5 percent of the intensity of the incident light.

27. The beamsplitter according to claim 13 wherein the first and second portions are approximately equal in intensity.

28. The beamsplitter according to claim 13 wherein the first and second portions have a combined intensity which is 0.1–5 percent of the intensity of the incident light.

* * * * *